US 7,262,471 B2

(12) United States Patent
Pan et al.

(10) Patent No.: US 7,262,471 B2
(45) Date of Patent: Aug. 28, 2007

(54) DRAIN EXTENDED PMOS TRANSISTOR WITH INCREASED BREAKDOWN VOLTAGE

(75) Inventors: Shanjen Pan, Plano, TX (US); Sameer Pendharkar, Allen, TX (US); James R. Todd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 301 days.

(21) Appl. No.: 11/047,418

(22) Filed: Jan. 31, 2005

(65) Prior Publication Data

US 2006/0170056 A1     Aug. 3, 2006

(51) Int. Cl.
*H01L 29/76*     (2006.01)
*H01L 29/94*     (2006.01)
*H01L 31/062*    (2006.01)
*H01L 31/113*    (2006.01)
*H01L 31/119*    (2006.01)

(52) U.S. Cl. ............... 257/368; 257/409; 257/E29.021; 438/197

(58) Field of Classification Search ................ 257/368, 257/409, E29.021; 438/197
See application file for complete search history.

(56) References Cited

U.S. PATENT DOCUMENTS

| | | | |
|---|---|---|---|
| 5,043,788 A * | 8/1991 | Omoto et al. ............... 257/371 |
| 5,852,314 A | 12/1998 | Depetro et al. | |
| 5,976,942 A | 11/1999 | Ludikhuize | |
| 6,211,552 B1 | 4/2001 | Efland et al. | |
| 6,376,891 B1 | 4/2002 | Nagatani et al. | |
| 6,475,870 B1 * | 11/2002 | Huang et al. ............... 438/316 |
| 6,531,355 B2 | 3/2003 | Mosher et al. | |
| 6,548,874 B1 | 4/2003 | Morton et al. | |
| 6,729,886 B2 | 5/2004 | Efland et al. | |
| 6,734,493 B2 | 5/2004 | Chen et al. | |
| 2002/0053695 A1 | 5/2002 | Liaw et al. | |
| 2004/0079991 A1 | 4/2004 | Lin et al. | |
| 2005/0001672 A1 * | 1/2005 | Scott et al. ............... 327/541 |

OTHER PUBLICATIONS

U.S. Appl. No. 10/880,907, filed Jun. 30, 2004, Pendharkar, Entire Document.
U.S. Appl. No. 10/890,648, filed Jul. 14, 2004, Pendharkar, Entire Document.
U.S. Appl. No. 10/302,256, filed Nov. 22, 2002, Hower et al., Entire Document.

* cited by examiner

*Primary Examiner*—Phat X. Cao
(74) *Attorney, Agent, or Firm*—Peter K. McLarty; W. James Brady, III; Frederick J. Telecky, Jr.

(57) ABSTRACT

A semiconductor device (102) that includes a drain extended PMOS transistor (CT1a) is provided, as well as fabrication methods (202) therefore. In forming the PMOS transistor, a drain (124) of the transistor is formed over a region (125) of a p-type upper epitaxial layer (106), where the region (125) of the p-type upper epitaxial layer (106) is sandwiched between a left P-WELL region (130a) and a right P-WELL region (130b) formed within the p-type upper epitaxial layer (106). The p-type upper epitaxial layer (106) is formed over a semiconductor body (104) that has an n-buried layer (108) formed therein. This arrangement serves to increase the breakdown voltage (BVdss) of the drain extended PMOS transistor.

19 Claims, 5 Drawing Sheets

US 7,262,471 B2

DRAIN EXTENDED PMOS TRANSISTOR WITH INCREASED BREAKDOWN VOLTAGE

FIELD OF INVENTION

The present invention relates generally to semiconductor devices, and more particularly to a drain extended PMOS transistor having a split drain implant that facilitates an increased breakdown voltage.

BACKGROUND OF THE INVENTION

Power semiconductor products are often fabricated using N or P channel drain-extended metal-oxide-semiconductor (DEMOS) transistor devices for high power switching applications. DEMOS devices advantageously combine short-channel operation with high current handling capabilities, relatively low drain-to-source on-state resistance (Rdson), and the ability to withstand high blocking voltages without suffering voltage breakdown failure (high breakdown voltage ratings). Breakdown voltage is typically measured as drain-to-source breakdown voltage with the gate and source shorted together (BVdss), where DEMOS device designs often involve a tradeoff between breakdown voltage BVdss and Rdson.

Referring to FIG. 1A a conventional drain extended PMOS control transistor CT1 is illustrated in an integrated circuit or semiconductor device 2 with a p-type drain 24 spaced from a gate 14, 16 having sidewall spacers 20. The transistor CT1 is formed in a p-doped silicon substrate 4 (P+) with a lower epitaxial silicon 4a (P-lower epi) formed over the substrate 4, where a p-type upper epitaxial silicon 6 (upper epi) is formed over the lower EPI 4a, and an n-buried layer 8 (NBL) extends in an upper portion of the lower EPI 4a and a lower portion of the upper EPI 6. An N-WELL 12 is formed in an upper portion of the upper EPI 6, leaving a p-type drift region 6a outside the N-WELL 12, and various field oxide (FOX) isolation structures 10 are formed to separate different terminals of the transistor CT1 from one another and from other components in the integrated circuit device 2.

A p-type source (S) 22 is formed in the N-WELL 12 along one side of a channel region 28 of the N-WELL 12, and an n-type backgate (BG) 26, in the illustrated example, is spaced from the source 22 in the N-WELL 12. A p-type extended drain (D) 24 is formed in the drift region 6a, and is spaced from the other side of the channel 28. The transistor gate structure (G) includes a thin gate dielectric or gate oxide 14 formed over the channel region 28 of the N-WELL 12, which also partially overlies a portion of the p-drift region 6a, with a conductive gate electrode 16 formed over the thin gate oxide 14 and sidewall spacers 20 formed along the lateral sides of the gate (G).

FIG. 1B is a schematic illustration of an exemplary high voltage application in which the conventional DEPMOS CT1 of FIG. 1A is employed as a control transistor for driving the gate of a bridge high-side driver DENMOS. FIG. 1B illustrates a half H-bridge driver circuit in the semiconductor device 2 powered by a DC supply voltage VCC, with the conventional DEPMOS control transistor CT1 of FIG. 1A and a DENMOS control transistor CT2 together forming an inverter for controlling a gate voltage of a high-side DENMOS drive transistor T2 in the half bridge circuit. The circuit includes two load driving n-channel power devices such as DENMOS or LDMOS (lateral diffused MOS) devices T1 and T2 having corresponding sources S1 and S2, drains D1 and D2, and gates G1 and G2, respectively, coupled to drive an inductive load. The transistors T1 and T2 are arranged as a pair of low and high-side drivers, respectively, with the load coupled between an intermediate node N1 of the driver pair and ground.

A supply voltage VCC is coupled to the drain D2 of the high-side driver T2, and can be a positive terminal of a battery source, wherein the ground may be the battery negative terminal, for example, in automotive applications. The low-side driver T1 and the high-side driver T2 are coupled in series between the supply voltage VCC and ground, where the high side driver transistor T2 has a drain D2 coupled to VCC and a source S2 coupled with the intermediate node N1 at the load. The low-side transistor T1 has a drain D1 coupled to the node N1 and a source S1 coupled to ground. The intermediate node N1 between the transistors T1 and T2 is coupled to a first terminal of a load and the other load terminal is coupled to ground, wherein the load is typically not a part of the device 2. The low and high side transistor gates G1 and G2 are controlled so as to drive the load in alternating fashion, wherein an inverter CT1, CT2 (including the DEPMOS transistor CT1 of FIG. 1A) is illustrated to drive the high-side gate G2. When the high-side transistor T2 is on, current flows through the high-side transistor T2 and the load in a first direction, and when the low-side transistor T1 is on, current flows through the load and the low-side transistor T1 in a second opposite direction.

In the illustrated device 2, the source S of the DEPMOS control transistor CT1 is coupled to a high voltage VCC+ VGS, where VGS is the gate-to-source voltage required to turn the high-side device T2 on, and VCC is the supply voltage. In this configuration, the upper control transistor CT1 must be designed to withstand high drain-to-source voltages without breakdown when the upper control transistor CT1 is off and the lower control transistor CT2 is on. In this condition, the drain D of the transistor CT1 is essentially at ground potential, while the source S remains at VCC+VGS. In automotive and other applications in which bridge driver circuits are used for high wattage digital audio equipment or in other high power circuits, the supply voltage VCC can be very high, such as 65 to 80 volts DC, wherein the driver devices T1 and T2 need to withstand drain-to-source voltages of about VCC without breakdown. Furthermore, the DEPMOS control transistor CT1 needs to withstand even higher drain-to-source voltages, since the drain D of the upper control transistor CT1 may be near ground potential when the lower control transistor CT2 is on. In particular, the VGS of the high-side driver transistor T2 may be 5 to 15 volts DC, wherein the off-state drain-to-source voltage across the DEPMOS transistor CT1 may be 100 volts or more.

As shown in FIG. 1A, the drain region 24 is spaced from the channel 28 and from the gate 14, 16 (e.g., an extended-drain architecture) to provide the drift region 6a in the p-type epitaxial silicon 6 between the channel 28 and the drain 24. In operation, the spacing of the drain 24 and the channel 28 spreads out the electric fields, thereby increasing the breakdown voltage rating of the device (higher BVdss). However, the drain extension increases the resistance of the drain-to-source current path (Rdson), whereby DEMOS device designs often involve a tradeoff between high breakdown voltage BVdss and low Rdson.

Another breakdown voltage limitation of the transistor CT1 relates to the thickness of the epitaxial silicon 6 in the device 2, wherein the substrate 4 is grounded and the transistor source, drain, and channel (e.g., including the N-WELL 12 and the p-drift region 6a) are formed in the epitaxial silicon 6. In particular, when the control transistor CT1 is on, the drain voltage is very high, and it is desirable to separate the p-type drain 24 and the drift region 6a from the underlying p-type substrate 4 that is grounded, to prevent punch-thru current between the drain 24 and the substrate 4. Accordingly, a rather heavily doped n-buried layer 8 is typically formed prior to forming the upper epitaxial silicon layer 6, in order to separate the drift region 6a and the drain 24 from the substrate 4, and to thereby inhibit on-state punch-thru current, with the n-buried layer 8 typically being connected to the n-type backgate 26 through the N-WELL 12, whereby the n-buried layer 8 is tied to the source voltage (VCC+VGS). However, the presence of the n-buried later at such a high voltage may lead to off-state breakdown when the drain 24 is near ground potential. Thus, while the n-buried layer 8 operates to prevent on-state punch-thru current, the n-buried layer 8 limits the off-state breakdown voltage rating of the DEPMOS transistor CT1 for a given epitaxial thickness and drift region doping amount.

In an "off" state of the transistor CT1, the drain 24 is essentially at ground, and the source voltage VCC+VGS is dropped across the drift region 6a portion extending between the bottom of the drain 24 and the n-buried layer 8, and also between the channel-side of the drift region 6a and the drain 24. If the breakdown occurs on the surface between the gate 16 and the p-type drain 24, the lateral extension of the drift region 6a can be increased (e.g., the lateral spacing of the drain 24 from the gate 16 may be increased to prevent lateral breakdown). However, the vertical spacing between the bottom of the p-type drain 24 and the n-buried layer 8 is more difficult to increase. One approach is to increase the thickness of the epitaxial silicon layer 6, wherein a thicker layer 6 allows a deeper drift region 6a to support higher voltages without suffering breakdown. However, increasing the epitaxial thickness is costly in terms of process complexity, larger spacing requirements, and larger design rules, particularly in forming the deep diffusions to connect to the n-buried layer 8 or other buried layers in the device 2. Accordingly, there is a need for improved DEPMOS devices and fabrication methods by which increased voltage breakdown withstanding capabilities can be achieved, without increasing epitaxial silicon thicknesses and without sacrificing device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The present invention relates to an improved drain extended PMOS (DEPMOS) transistor that has an increased breakdown voltage.

According to one or more aspects of the present invention, a method of fabricating a drain-extended MOS transistor is disclosed. The method includes providing a p-type semiconductor body, forming an n-buried layer in the semiconductor body and forming a p-type upper epitaxial layer over the semiconductor body. A left N-WELL region is then formed in the p-type upper epitaxial layer, followed by a split P-WELL region which is also formed in the p-type upper epitaxial layer. A gate is then formed over the p-type upper epitaxial layer, and a p-type source region is formed in the left N-WELL region adjacent to a left side of the gate. Subsequently, a p-type drain region is formed in the p-type upper epitaxial layer between a left P-WELL region and a right P-WELL region of the split PWELL region in the p-type upper epitaxial layer. The p-type drain region is formed to a right side of the gate.

The following description and annexed drawings set forth in detail certain illustrative aspects and implementations of the invention. These are indicative of but a few of the various ways in which principles of the invention may be employed.

DETAILED DESCRIPTION OF THE INVENTION

Figure 1A:
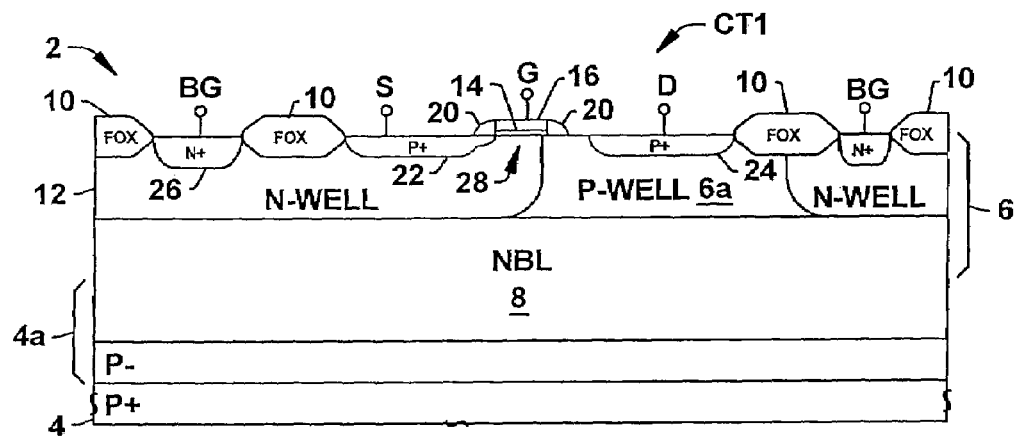
FIG. 1A is a partial side elevation view in section illustrating a semiconductor device having a conventional drain extended PMOS transistor.

One or more implementations of the present invention will now be described with reference to the attached drawings, wherein like reference numerals are used to refer to like elements throughout, and wherein the illustrated structures are not necessarily drawn to scale. The invention provides drain extended PMOS (DEPMOS) transistors and associated fabrication techniques by which various shortcomings of conventional DEPMOS transistors can be mitigated or overcome, and which may be employed to facilitate increased breakdown voltage ratings without increased epitaxial silicon thicknesses.

Figure 1B:
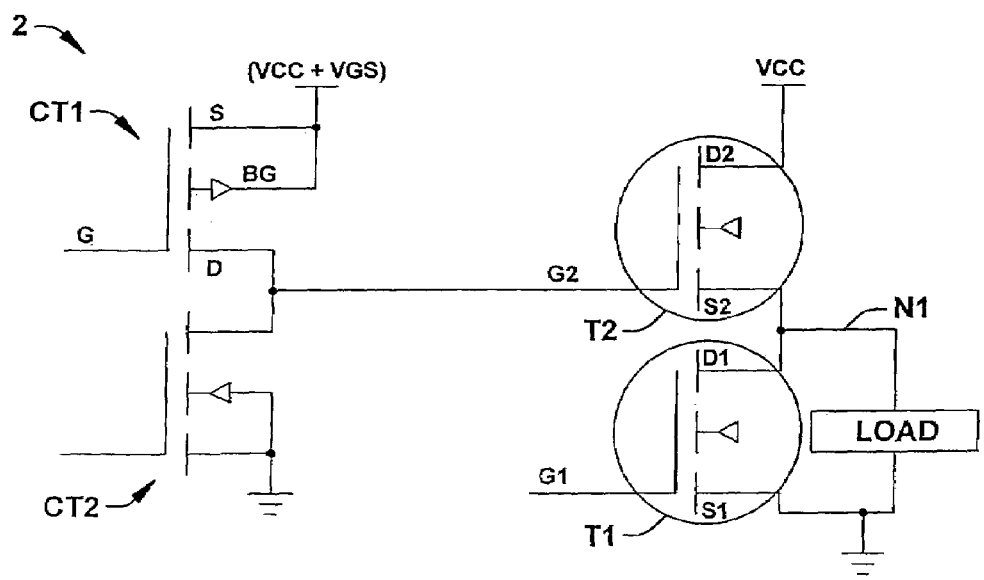
FIG. 1B is a schematic diagram illustrating a half H-bridge circuit for driving a load using low and high-side drain-extended NMOS devices, with an inverter that includes the conventional DEPMOS device of FIG. 1A for driving the high side device gate.
Figure 2:
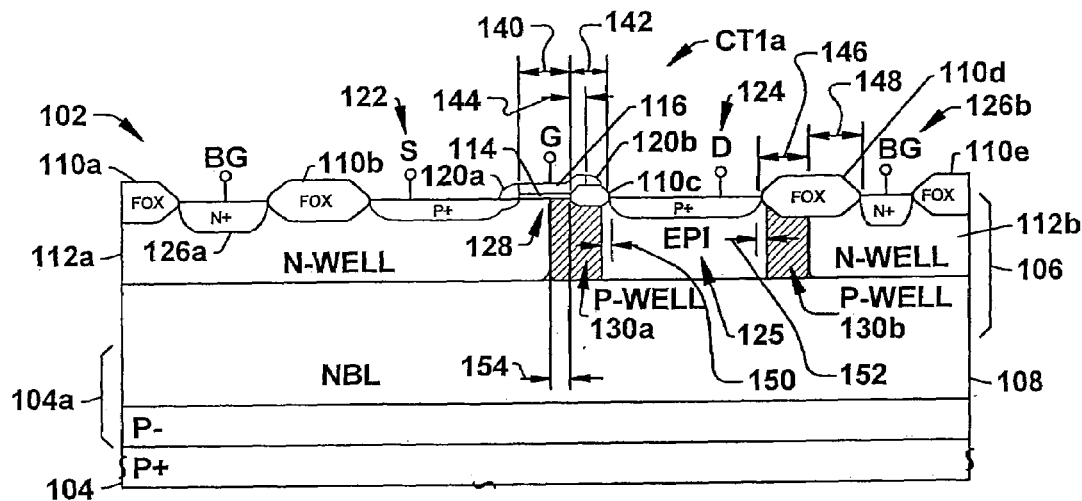
FIG. 2 is a partial side elevation view in section illustrating an exemplary drain extended PMOS transistor (DEPMOS) having a split patterned drain implant that contributes to an increased breakdown voltage in accordance with one or more aspects of the present invention.

Referring now to FIG. 2, an exemplary DEPMOS transistor CT1a is illustrated in a semiconductor device 102 in accordance with one or more aspects of the present invention. The transistor CT1a may be employed in any type of circuit, and provides particular advantages in applications requiring high breakdown voltage withstanding capabilities, such as in the upper inverter transistor of FIG. 1B for controlling the gate voltage G2 of a high-side bridge driver transistor, for example. The device 102 is formed in a composite semiconductor body 104, 106, beginning with a p-doped silicon substrate 104 (P+), where a lower epitaxial silicon 104a (P-lower epi) is formed over the substrate 104, and a p-type upper epitaxial silicon 106 (upper epi) is formed over the lower EPI 104a. The semiconductor devices and DEPMOS transistors of the present invention may be fabricated in any type of semiconductor body 104, including but not limited to semiconductor (e.g., silicon) wafers, silicon-over-insulator (SOI) wafers, epitaxial layers in a wafer, or other composite semiconductor bodies, etc., wherein the invention and the appended claims are not limited to the illustrated structures or materials.

An n-buried layer 108 (NBL) extends into an upper portion of the lower EPI 104a and a lower portion of the upper EPI 106. In the illustrated example, left and right N-WELL regions 112a, 112b are formed in an upper portion of the upper EPI 106. Various field oxide (FOX) isolation structures 110a-110e are formed to separate different terminals of the transistor CT1a from one another and from other components in the device 102, although other isolation techniques may be used (e.g., shallow trench isolation (STI), local oxidation of silicon (LOCOS), etc.).

The exemplary DEPMOS transistor CT1a comprises a gate (G) having a thin gate dielectric 114 that underlies a conductive gate electrode 116, where the gate 114, 116 overlies a channel region 128 in the semiconductor body 104 and is abutted by a left sidewall spacer 120a along a left lateral side and a right sidewall spacer 120b along a right lateral side. A p-type source (S) 122 is formed in the semiconductor body within left N-WELL region 112a. Similarly, left and right n-type backgates (BG) 126a, 126b are formed within left and right N-WELL regions 112a, 112b, respectively. The source 122 has left and right laterally opposite sides, with the right lateral side located along a left lateral side of a channel 128 proximate the left lateral side of the gate, where the left opposite side of the source 122 is separated from the left backgate 126a by isolation structure 110b.

A split P-WELL having left and right regions 130a, 130b is also formed in an upper portion of the upper EPI 106 such that a p-type drain (D) 124 formed in the semiconductor body overlies a region 125 of upper EPI 106 that is abutted by the left and right P-WELL regions 130a, 130b. The channel region 128 underlying the gate 114, 116 is thereby established within some of the left N-WELL region 112a and some of the left split P-WELL region 130a. The p-type drain (D) 124 is spaced from the right side of the gate 114, 116 to provide an extended drain, wherein the n-buried layer 108 is situated in the upper and lower epitaxial silicon layers 106, 104a beneath at least a portion of the gate 114, 116 and the drain 124.

With regard to some of the dimensions of the features, a distance 140 between about the right side of the source 122 and about a left side of isolation structure 110c is about 0.5 um and above. A distance 142 between about the left side of isolation structure 110c and about the right side of isolation structure 110c is between about 0.5 um and about 5 um. Similarly, a distance 144 between about the left side of the isolation structure 110c and the right side of the gate structure 114, 116 is between about 0.3 um and about 2 um. A distance 146 between about the left side of isolation structure 110d and about a left side of the right N-WELL 112b is between about 0.5 um and about 5 um. Likewise, a distance 148 between about the left side of the right N-WELL 112b and about a right side of isolation structure 110d is between about 0.5 um and about 5 um. Also, a distance 150 between about a right side of the left P-WELL region 130a and about the right side of isolation structure 110c is between 0 um and about 1 um. Similarly a distance 152 between about the left side of the right P-WELL region 130b and about the left side of isolation structure 110d is between about 0 um and about 1 um. As a final example, a distance 154 between about a right side of the left N-WELL region 112a and about the left side of isolation structure 110c is between about 0.3 um and about 1.5 um. It will be appreciated that the left and right P-WELL regions 130a, 130b may diffuse laterally under the drain 124 by about distances 150 and 152 respectively as a result of annealing or heat treating, for example. In so doing, areas of the EPI region 125 corresponding to these distances 150, 152 may have a slightly increased p dopant concentration, such as between about low E16 cm$^2$ and about mid E16 cm$^2$, for example, where the left and right P-WELL regions 130a, 130b have a p dopant concentration of about low E16 cm$^2$ and the upper EPI 106 has an p dopant concentration of about low E15 cm$^2$, for example.

A transistor formed according to that which is disclosed herein has a breakdown voltage BVdss that is increased to around 40 volts as compared to a comparable conventional transistor that has a lesser breakdown voltage of around 40 volts. The breakdown voltage is increased as the left and right P-WELL regions 130a, 130b and the EPI region 125 underlying the drain 124 facilitate more evenly distributed field (lines) between the drain 124 and the NBL 108. In this manner, the transistor breakdown voltage BVdss is essentially decoupled to an extent from the epitaxial thickness, and the breakdown voltage can be increased without having to make the upper epitaxial silicon 106 thicker.

Figure 3:
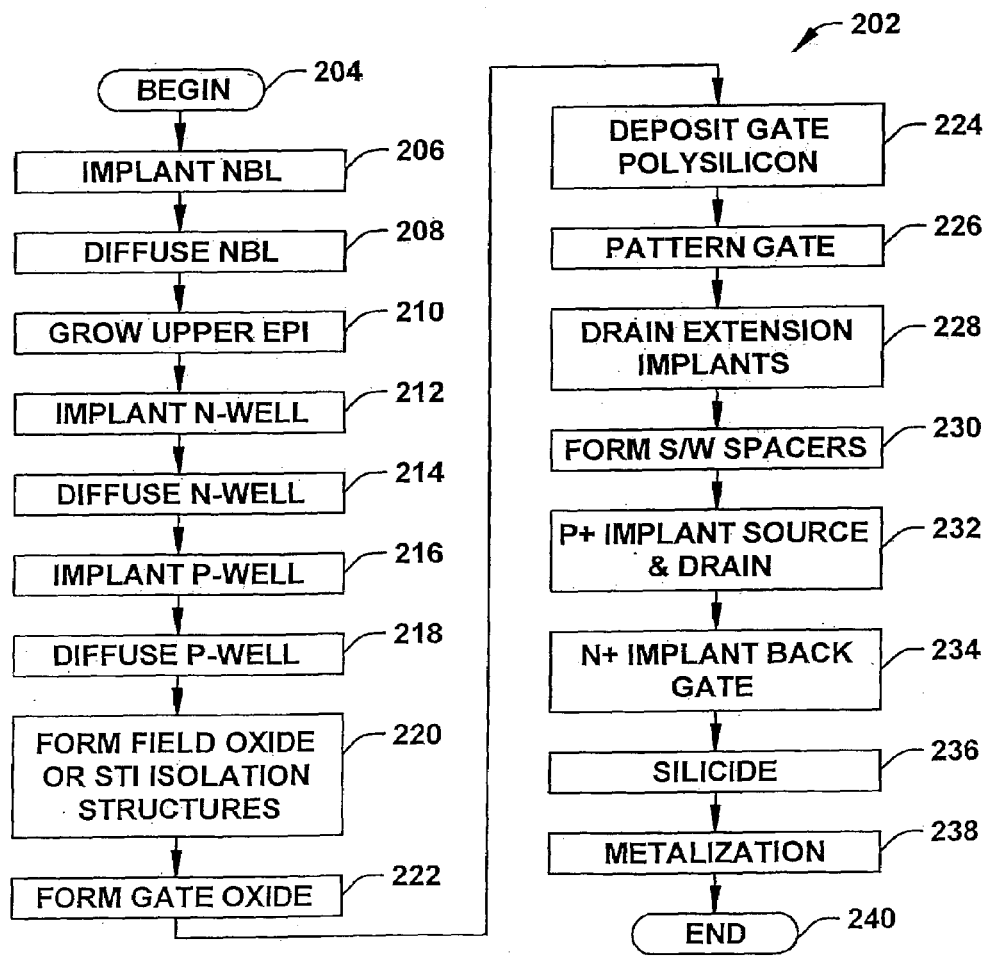
FIG. 3 is a flow diagram illustrating a method for fabricating a semiconductor device with a DEPMOS transistor in accordance with one or more aspects of the present invention.

Turning to FIG. 3, an exemplary method 202 for fabricating a semiconductor device and DEPMOS transistor, such as that depicted in FIG. 2, is illustrated in accordance with one or more aspects of the present invention. FIGS. 4A-4G similarly illustrate an exemplary semiconductor device, such as that depicted in FIG. 2, where the device is illustrated at various stages of fabrication that are generally in accordance with the method 202 of FIG. 3. Although the exemplary method 202 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices and DEPMOS transistors thereof which are illustrated and described herein as well as in association with other devices and structures not illustrated.

Figure 4A:
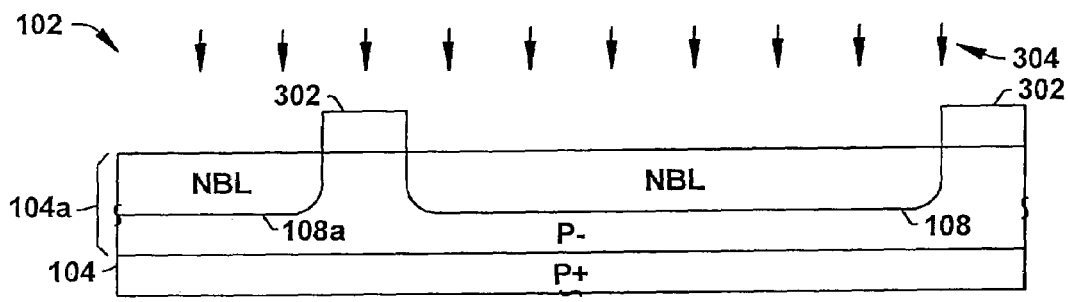
FIGS. 4A-4G are partial side elevation views in section illustrating an exemplary integrated circuit including a DEPMOS transistor at various stages of fabrication in accordance with one or more aspects of the present invention.

As illustrated in FIGS. 3 and 4A, the method 202 begins at 204, with an n-buried layer (NBL) 108 (e.g., of Antimony (Sb)) being initially implanted at 206 into the lower EPI layer 104a of a semiconductor substrate 104 using an implant mask 302 and an implantation process 304, where the n-buried layer may optionally be thermally diffused at 208 following the implantation process 304. In the exemplary semiconductor device 102, an n-buried layer 108 is initially implanted or diffused in a prospective DEPMOS portion of the lower epitaxial silicon 104a. It will be appreciated that other n-buried layers (e.g., layer 108a in FIG. 4A) may be concurrently formed for use in other transistors of the device 102, wherein the implanted n-type impurities may, but need not, extend into the silicon 104 beneath the lower EPI layer 104a. It will also be appreciated that any suitable processing techniques may be used in forming an n-buried layer in a semiconductor body within the scope of the invention, including but not limited to implantation, diffusion, etc., using any suitable implantation mask 302, process 304, and equipment.

By way of example, as with all layers described herein (unless specifically indicated otherwise), n-buried layer 108 can, at least partially, be formed via lithographic techniques, where lithography generally refers to processes for transferring one or more patterns between various media. In lithography, a radiation sensitive resist coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of resist used. A developer is then used to remove the more soluble areas of the resist leaving a patterned resist. The pattered resist can then serve as a mask for the underlying layers which can be selectively treated, such as to receive dopants and/or undergo etching.

Figure 4B:
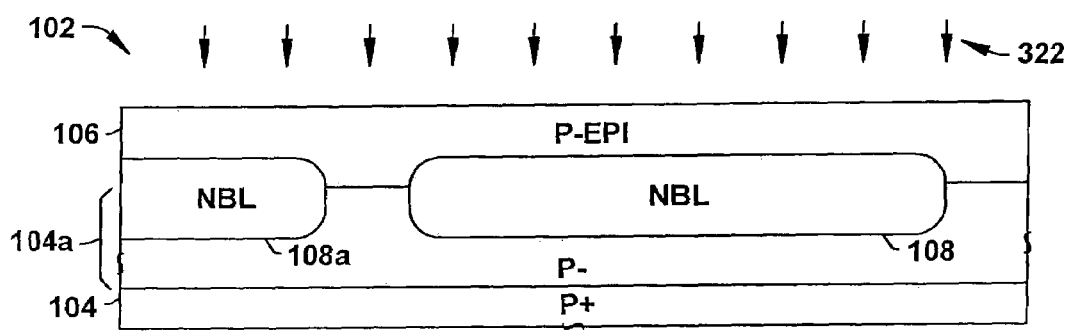

Referring to FIG. 4B, an epitaxial growth process is performed at 210 to grow the upper epitaxial silicon layer 106 above the substrate 104 and the lower EPI 104a, thereby forming a composite semiconductor body 104, 106, wherein the upper epitaxial silicon is provided with p-type dopants to form the p-type upper epitaxial silicon layer 106. Any suitable epitaxial growth processing may be employed at 210 by which an epitaxial silicon layer 106 is formed over the upper surface of the lower EPI 104a. In the illustrated example in FIG. 4B, the upper epitaxial silicon layer 106 is formed using an epitaxial growth process 322, wherein the thermal energy associated with the process 322 causes some upward diffusion of the n-buried layers 108 and 108a into the upper epitaxial silicon 106.

Figure 4C:
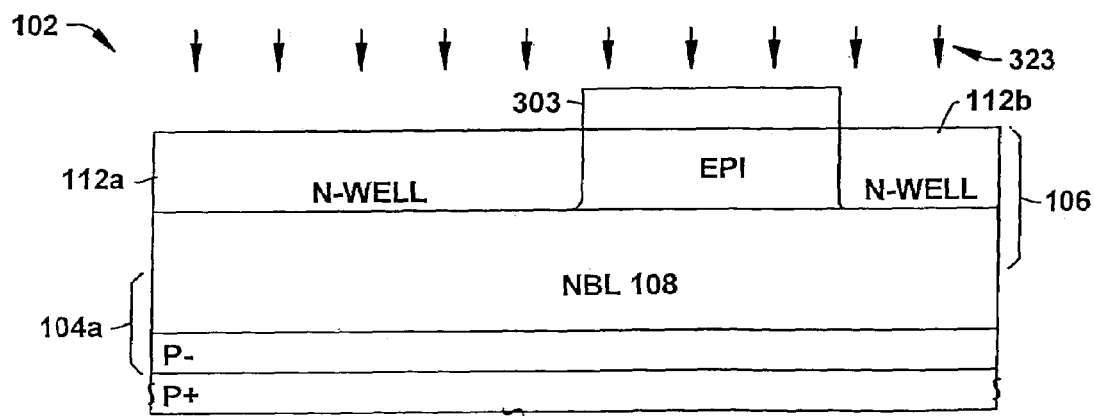

Referring to FIG. 4C, wherein NBL 108 is focused in on (e.g., to the exclusion of layer 108a—as is also the case in FIGS. 4D thru 4G), left and right N-WELL regions 112a, 112b are formed at 212 via an implantation process 323 in the upper portion of the epitaxial silicon 106, where the N-WELL regions 112a, 112b may then be thermally diffused at 214. Any suitable implant masking and implantation process may be employed at 212 to form the N-WELL regions 112a, 112b, such as using a patterned mask 303 and a Phosphorus (P) implant, for example.

Figure 4D:
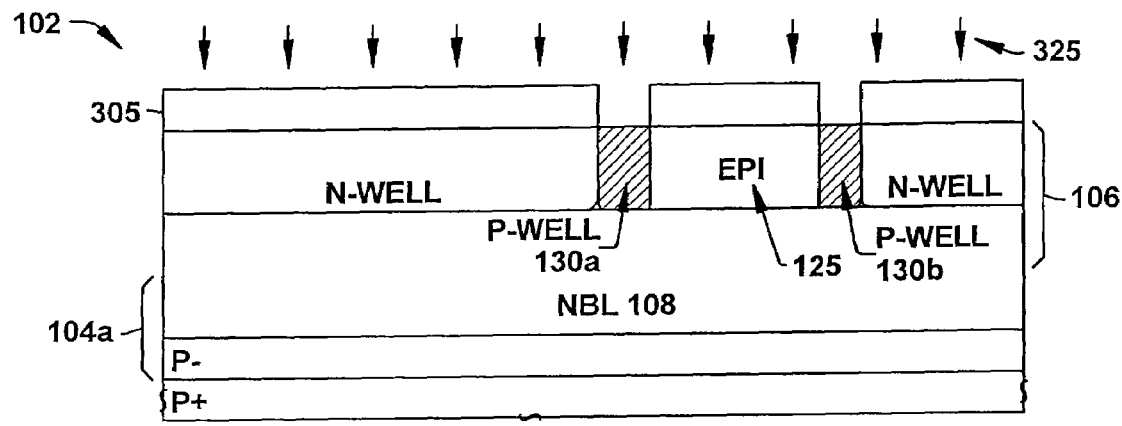

FIG. 4D illustrates that a split P-WELL implant 325 is then performed at 216 to form left and right P-WELL regions 130a, 130b in an upper portion of the upper EPI 106. It will be appreciated that this implant establishes EPI region 125 between the left and right P-WELL regions 130a, 130b. The P-WELL regions 130a, 130b may then be thermally diffused at 218 whereby p-type dopant may creep into region 125 by amounts 150, 152 as illustrated in FIG. 2. It will be appreciated that any suitable implant masking and implantation process may be employed at 216 to form the split P-WELL regions 130a, 130b, such as using a patterned mask 305 and a Boron (B) implant, for example.

Figure 4E:
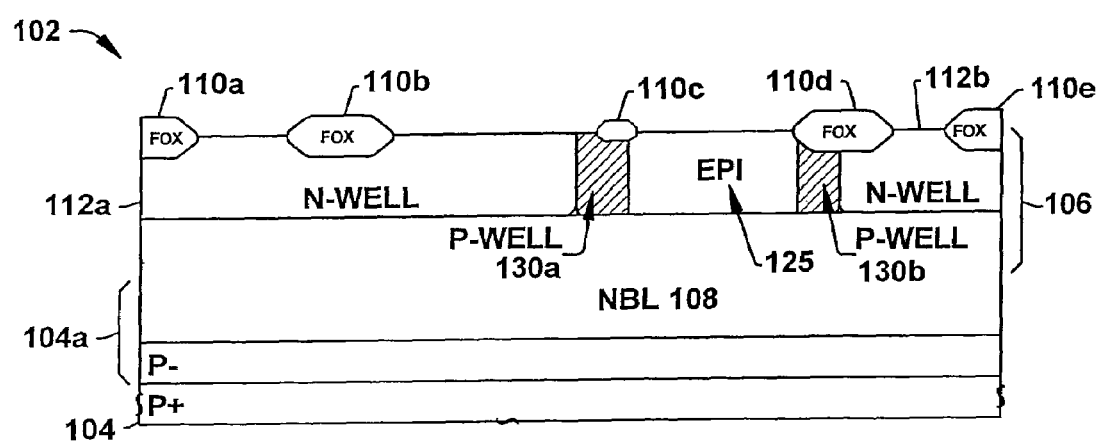

At 220 in FIG. 3, isolation structures 110a-110e are then formed in the upper portion of the upper EPI layer 106 using any suitable techniques, such as local oxidation of silicon (LOCOS), shallow trench isolation techniques (STI), deposited oxide, etc. In the exemplary device 102, field oxide (FOX) structures are formed as illustrated in FIG. 4E.

Figure 4F:
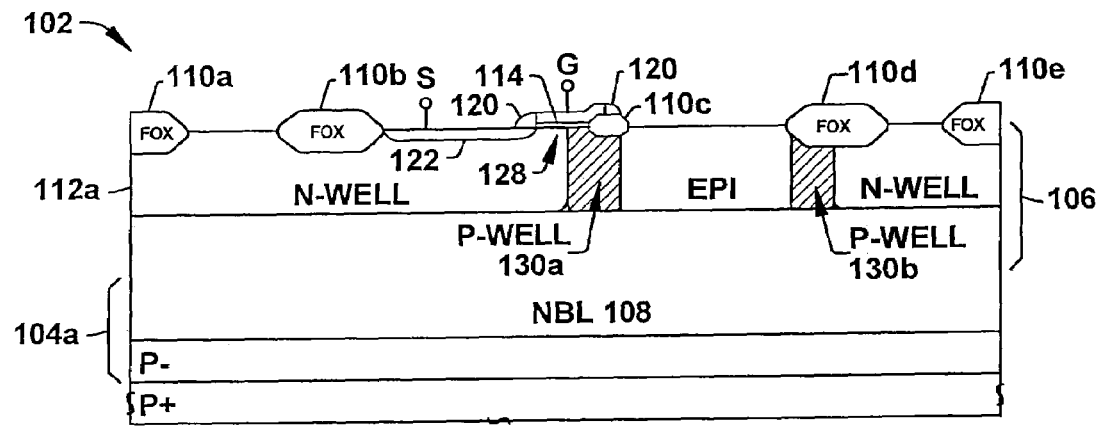

As illustrated in FIG. 4F, a thin gate oxide 114 is formed (e.g. at 222 in the method 202) over the upper surface of the epitaxial layer 106. The gate oxide 114 can be formed by any suitable material formation process, such as thermal oxidation processing, for example. At 224, a gate polysilicon layer 116 is deposited over the thin gate oxide 114, and is patterned at 226 to form a gate structure 114, 116 extending over channel region 128 formed within part of the left N-WELL region 112a and part of the left P-WELL region 130a. With the patterned gate structure formed, LDD, MDD, or other drain extension implants (not shown) are performed at 228, for example, including a shallow p-type implant to initially define the p-type source 122, and left and right sidewall spacers 120a, 120b are formed at 230 along the left and right lateral sidewalls of the patterned gate structure 114, 116, respectively, as shown in FIG. 4F.

Figure 4G:
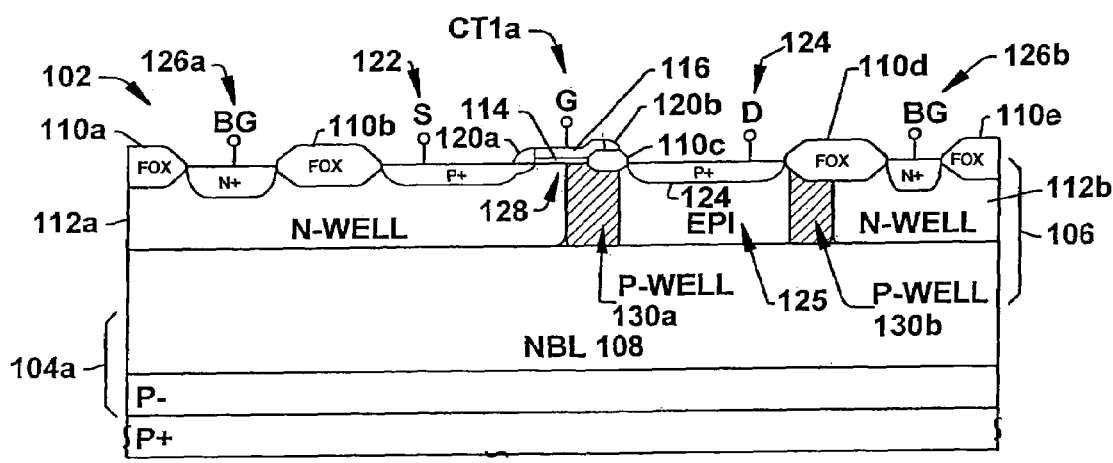

Referring to FIG. 4G, a p-type source/drain implant (e.g., of boron (B)) is then performed at 232 to further define the source (S) 122 within the left N-WELL region 112a, as well as the drain (D) 124 in region 125 of the upper portion of the p-type upper epitaxial layer 106. As illustrated in FIG. 4G, respective backgates (BG) 126a, 126b are implanted with n-type dopants (e.g., phosphorous (P), arsenic (As), antimony (Sb)) at 234 in the left and right N-WELL regions 112a, 112b wherein any suitable masks and implantation processes may be used in forming the p-type source 122, the p-type drain 124, and the n-type backgates 126a, 126b. Silicide, metalization, and/or other back-end processing (not shown) are then performed at 236 and 238 to complete the device 102, after which the method 202 ends at 240 in FIG. 3.

Note that although the present examples provided herein are provided in the context of a device having two EPI regions with one or more buried layers formed after the lower EPI is formed, but before the upper EPI is formed, the above structure may be formed in the starting material using high energy implants. For example, the n-buried layer can be formed with high energy implants, and such variations are contemplated as falling within the scope of the present invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A drain extended PMOS transistor, comprising:
a gate overlying a channel region formed within a semiconductor substrate;
a p-type source region formed within the semiconductor substrate to the left of the channel region; and
a p-type drain region formed within the semiconductor substrate to the right of the channel region, where the p-type drain region is formed over a region of the semiconductor substrate that is sandwiched between a left P-WELL region and a right P-WELL region formed within the semiconductor substrate, wherein a left N-WELL region, the p-type source region, the p-type drain region, the left P-WELL region and the right P-WELL region are formed within a p-type upper epitaxial layer formed on the semiconductor substrate.

2. The transistor of claim 1, wherein the p-type source region is formed within the left N-WELL region formed within the semiconductor substrate.

3. The transistor of claim 2, wherein the channel region is established within at least some of the left N-WELL region and at least some of the left P-WELL region.

4. The transistor of claim 1, wherein an n-buried layer is formed in the semiconductor substrate under the p-type upper epitaxial layer.

5. The transistor of claim 4, wherein at least one of: areas of the p-type upper epitaxial layer adjacent to the left and right P-WELL regions and below the drain region have a dopant concentration of between about low E16 cm$^2$, the left P-WELL region has a dopant concentration of between about mid E16 cm$^2$ and the p-type upper epitaxial layer has a dopant concentration of between about low E15 cm$^2$.

6. A semiconductor device, comprising:
a semiconductor body including a p-type upper epitaxial layer;
an n-buried layer formed under the p-type upper epitaxial layer in the semiconductor body; and
a drain-extended PMOS transistor formed over the p-type upper epitaxial layer, where a p-type drain region of the PMOS transistor is formed in a region of the p-type upper epitaxial layer that is sandwiched between a left P-WELL region and a right P-WELL region formed within the p-type upper epitaxial layer.

7. The device of claim 6, wherein a p-type source region of the PMOS transistor is formed in a left N-WELL region formed within the p-type upper epitaxial layer.

8. The device of claim 7, wherein a channel region situated under the gate and between the source and drain regions is established in at least some of the left N-WELL region and at least some of the left P-WELL region.

9. The device of claim 8, further comprising a left n-type backgate region formed in the left N-WELL region to the left of the source region.

10. The device of claim 9, wherein the left n-type backgate region is separated from the source region by an isolation structure.

11. The device of claim 10, further comprising a right N-WELL region formed within the p-type upper epitaxial layer and a right n-type backgate region formed within the right N-WELL region.

12. The device of claim 11, wherein the right n-type backgate region is separated from the drain region by an isolation structure.

13. The device of claim 12, wherein the right N-WELL region is separated from a region of the p-type upper epitaxial layer situated below the drain region by the right P-WELL region.

14. A method of fabricating a drain-extended MOS transistor, the method comprising:
providing a p-type semiconductor body;
forming an n-buried layer in the semiconductor body;
forming a p-type upper epitaxial layer over the semiconductor body;
forming a left N-WELL region in the p-type upper epitaxial layer;
forming a split P-WELL region in the p-type upper epitaxial layer;
forming a gate over the p-type upper epitaxial layer;
forming a p-type source region in the left N-WELL region adjacent to a left side of the gate; and
forming a p-type drain region in the p-type upper epitaxial layer between a left P-WELL region and a right P-WELL region of the split PWELL region in the p-type upper epitaxial layer and to a right side of the gate.

15. The method of claim 14, wherein a channel region situated under the gate and between the source and drain regions is established in at least some of the left N-WELL region and at least some of the left P-WELL region.

16. A method of fabricating a semiconductor device, the method comprising:
providing a semiconductor body;
forming an n-buried layer in the semiconductor body;
forming a p-type upper epitaxial layer over the semiconductor body; and
forming a drain-extended PMOS transistor over the semiconductor body, where a drain of the PMOS transistor is formed in a region of the p-type upper epitaxial layer that is sandwiched between a left P-WELL region and a right P-WELL region formed within the p-type upper epitaxial layer.

17. The method of claim 16, further comprising:
forming a p-type source region of the PMOS transistor in a left N-WELL region formed within the p-type upper epitaxial layer.

18. The method of claim 17, wherein a channel region situated under the gate and between the source and drain regions is established in at least some of the left N-WELL region and at least some of the left P-WELL region.

19. The method of claim 18, further comprising forming a left n-type backgate region in the left N-WELL region to the left of the source region.

* * * * *